United States Patent
Kim et al.

(10) Patent No.: US 7,123,105 B2
(45) Date of Patent: Oct. 17, 2006

(54) OSCILLATOR WITH TEMPERATURE CONTROL

(75) Inventors: Jung Pill Kim, Cary, NC (US); Jens Christopher Egerer, Munich (DE); Stephen Bowyer, Raleigh, NC (US)

(73) Assignee: Infineon Technologies North American Corporation, San Jose, CA (US)

( * ) Notice: Subject to any disclaimer, the term of this patent is extended or adjusted under 35 U.S.C. 154(b) by 135 days.

(21) Appl. No.: 10/739,398

(22) Filed: Dec. 19, 2003

(65) Prior Publication Data

US 2005/0134393 A1  Jun. 23, 2005

(51) Int. Cl.
*H03K 3/02* (2006.01)

(52) U.S. Cl. .................... 331/66; 331/176; 331/143; 365/222

(58) Field of Classification Search ........ 331/143–153, 331/66, 176; 365/222
See application file for complete search history.

(56) References Cited

U.S. PATENT DOCUMENTS

| | | | |
|---|---|---|---|
| H000965 H * | 9/1991 | Davis et al. ............... | 330/254 |
| 6,859,750 B1 * | 2/2005 | Frazier ...................... | 702/124 |
| 2002/0075083 A1 * | 6/2002 | Rashid ...................... | 331/36 C |
| 2003/0156483 A1 * | 8/2003 | Feurle et al. ............... | 365/222 |
| 2005/0134393 A1 * | 6/2005 | Kim et al. .................. | 331/36 C |

* cited by examiner

*Primary Examiner*—Michael B Shingleton
(74) *Attorney, Agent, or Firm*—Edell, Shapiro & Finnan, LLC

(57) ABSTRACT

An oscillator circuit includes a capacitor device, a current source for supplying a current to the capacitor device, a reference voltage, and a control circuit. The reference voltage is a first input to a comparator. An output of the capacitor device and an output of the current source are a second input to the comparator. The control circuit resets the oscillator circuit when the first and second inputs to the comparator are equal.

13 Claims, 8 Drawing Sheets

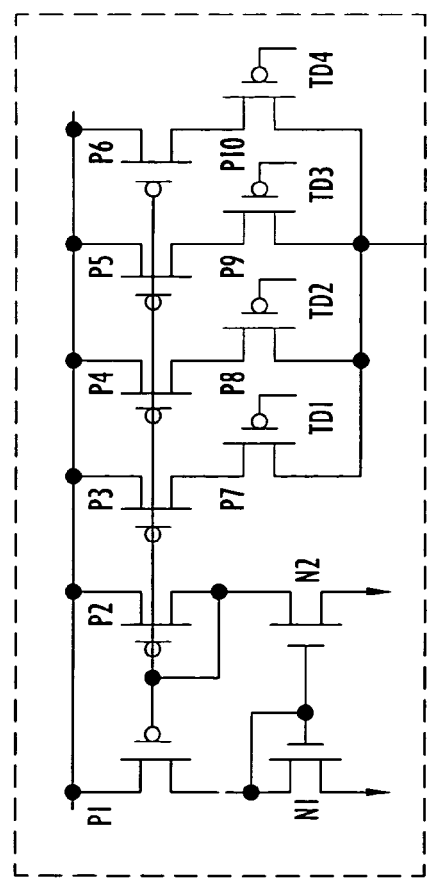
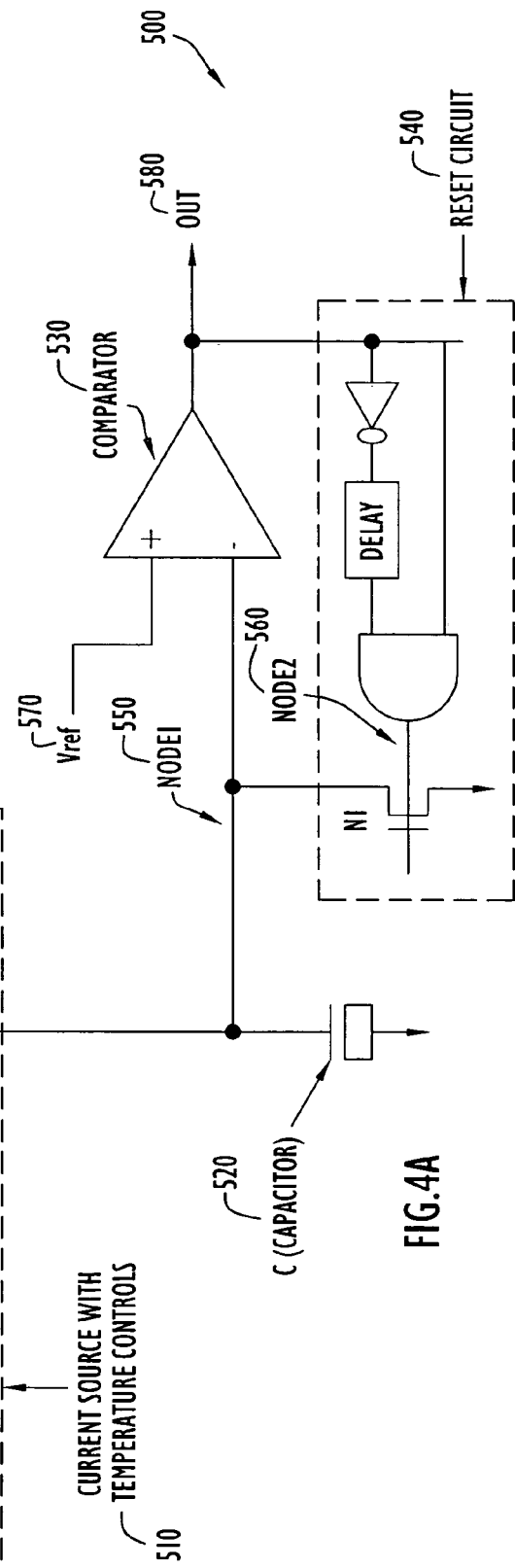
FIG.4B
FIG.4A

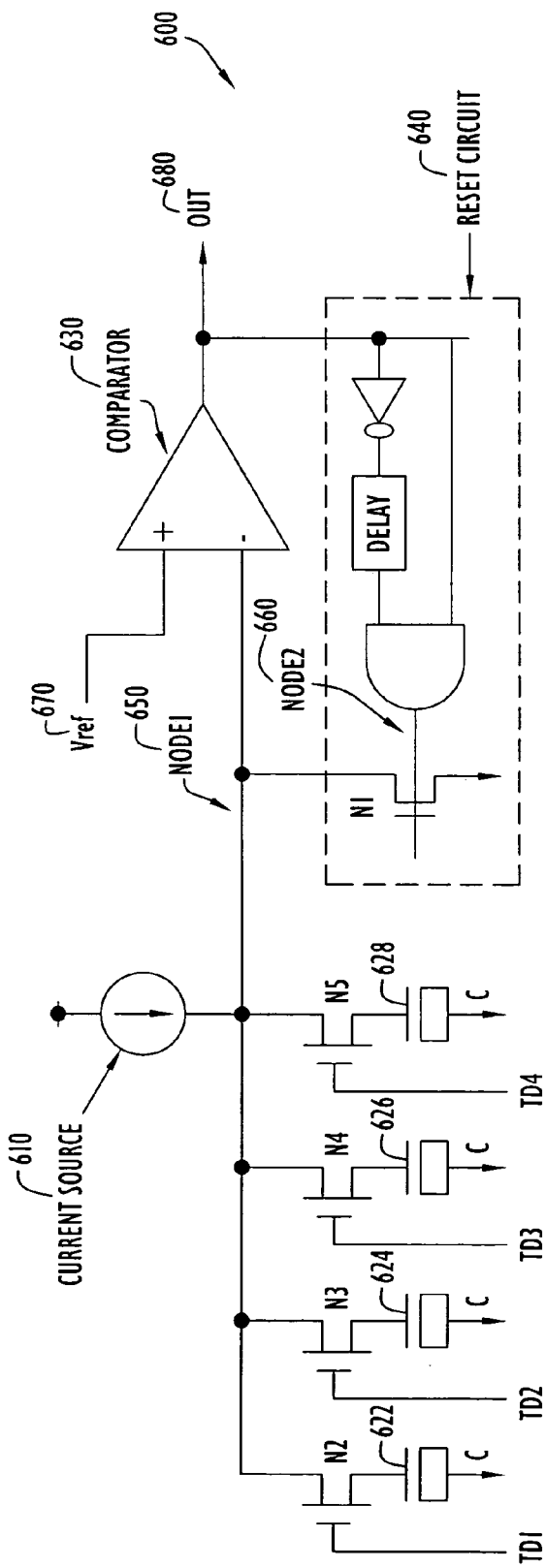

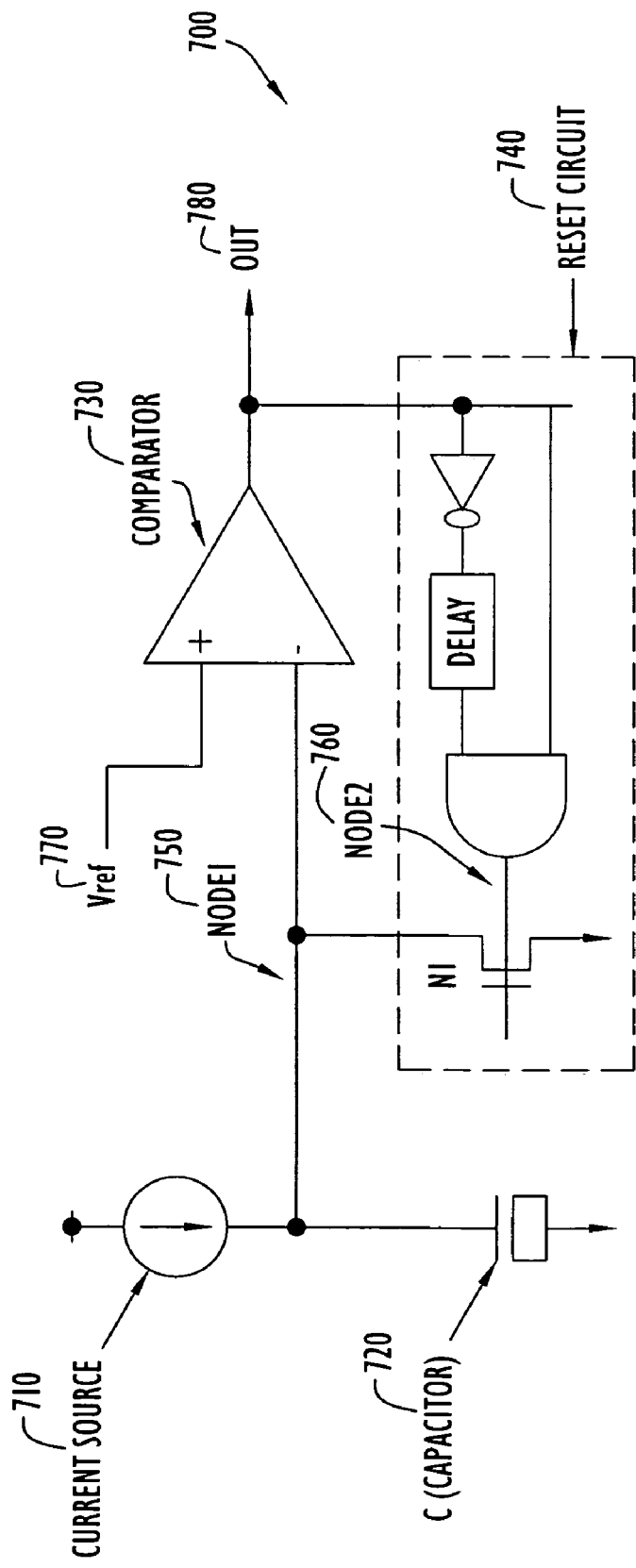

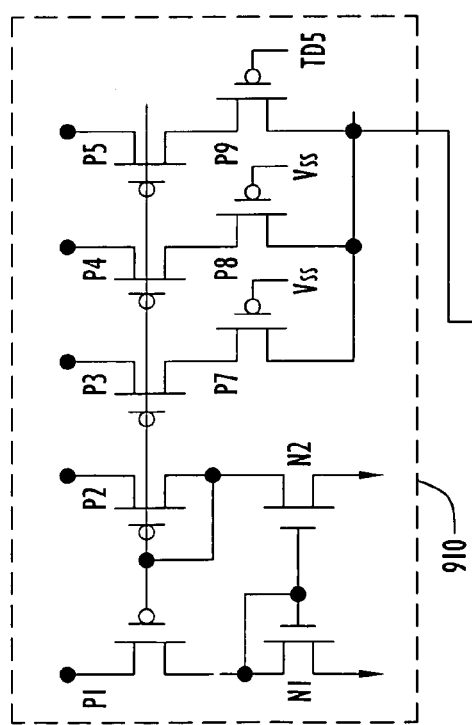
FIG.8C
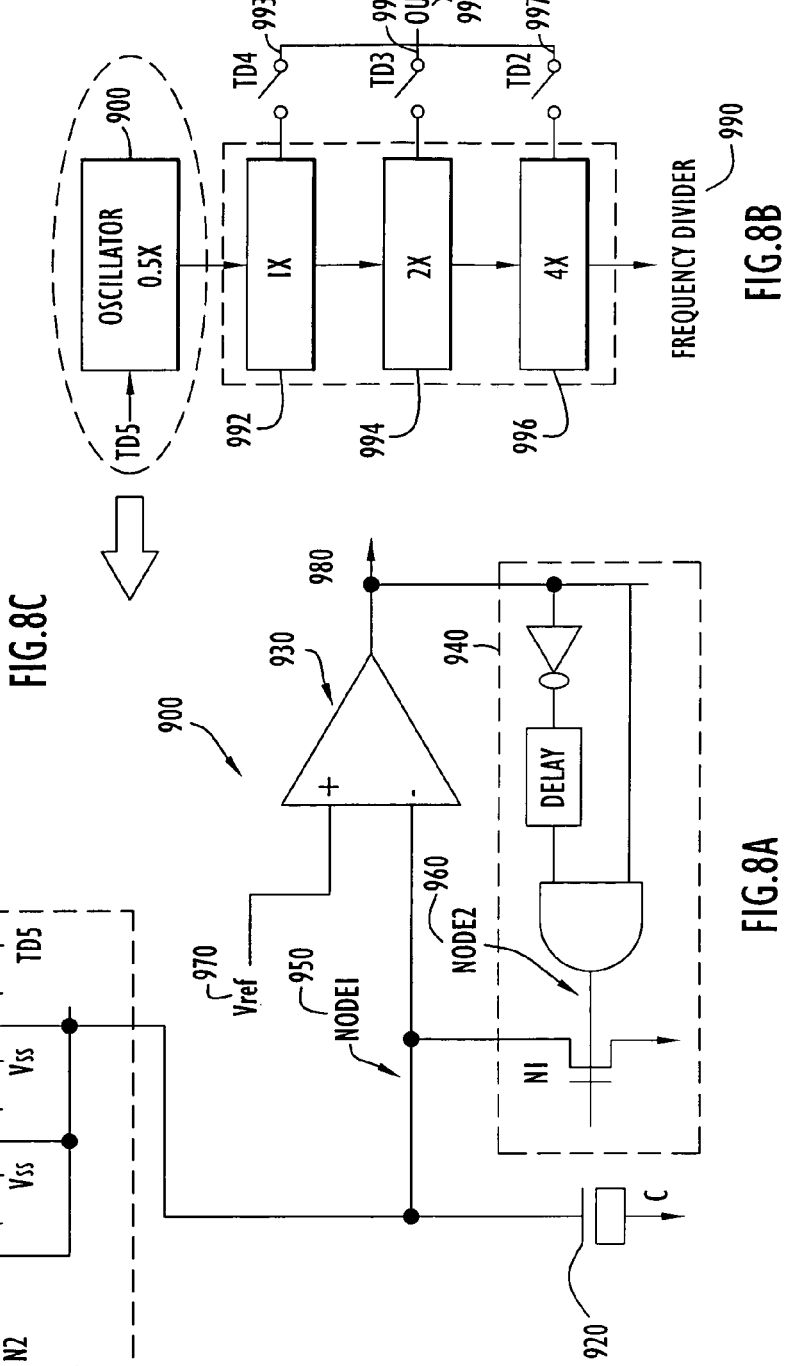
FIG.8B
FIG.8A

OSCILLATOR WITH TEMPERATURE CONTROL

FIELD OF THE INVENTION

This invention relates to power conservation in electronics, and more particularly, conserving power by controlling the refresh rate of an oscillator using temperature variation.

BACKGROUND

In recent years, the demand for low-power and low-voltage memory has increased as portable and handheld devices such as PDAs, cellular phones, and notebook computers have become more popular. With such features, i.e., low power and low voltage memory, longer battery life in these popular portable devices is possible.

An issue when designing low-power and low-voltage memory is accounting for the self-refresh current. The self-refresh current (IDD6) is a current used by devices in standby modes. As such, the self-refresh current is an important parameter in the low-power and low-voltage memory design.

The self-refresh current can be expressed as follows:

$$IDD6 = \frac{Iarray + Iperi}{Tref} + I_{DC} \tag{1}$$

where Iarray, Iperi, IDC, and Tref denote an array current, a peripheral current, a DC current, and a refresh period, respectively. The DC current IDC is generally small, and the array current Iarray is the largest factor in the self-refresh current IDD6. Tref is a fixed refresh period and is determined by the refresh characteristics of the cells. Since cells generally refresh most frequently at a higher temperature, the refresh period Tref is determined using high temperature conditions.

Referring to FIGS. 1A, 1B, 2A, and 2B, conventional analog and/or digital designs have attempted to minimize/address power consumption by the self-refresh current IDD6. The oscillator 100 generates a base frequency, for example, 0.5× and the frequency divider generates additional refresh periods, i.e., 1×, 2× and 4× refresh periods, using the base frequency. A conventional oscillator circuit and the timing diagram of the oscillator is a current analog solution, as shown in FIGS. 1A and 1B. Such a prior art oscillator has a current source 110, a capacitor 120, a comparator 130, and a reset circuit 140. The reset circuit 140 initializes node 1 150 to ground. The current source 110 provides a constant current i to node 1 150, and the value at node 1 150 increases linearly according to the capacitance C 120 and current i provided by the current source 110. When the voltage at the node 1 150 reaches the level of the reference voltage Vref 170, the output 180 of the comparator 130 is switched to 'H', and node 1 150 is reset to ground for the next operation. The oscillator period Tosc (see FIG. 1B) is determined by the capacitor C 120, the current i from the current source 110, and the reference voltage Vref 170.

Referring to FIG. 2A, a solution using digital logic to generate various refresh periods is also known. The oscillator 200 generates a base frequency, for example, 0.5× and the frequency divider 290 generates additional refresh periods, i.e., 1×, 2× and 4× refresh periods 292, 294, 296, using the base frequency. As shown in the table (see FIG. 2B), intermediate refresh periods, i.e., 1.5×, 2.5×, and 3.5×, are generated by combinational logic 220. Using the refresh periods generated by the oscillator 200, the frequency divider 290, and the combinational logic 220, one refresh period can be selected, i.e., TD<0:7>. The refresh period can be selected by the temperature information device (not shown), which provides the temperature information from a Temperature Compensated Self Refresh (TCSR) mode or an on-chip thermometer.

However, using only digital logic requires a large amount of space and is very complex. A frequency divider and combinational logic further increase the complexity in order to determine the additional refresh periods.

A simple method to vary refresh periods of an oscillator using minimal space as compared to a purely digital solution is desirable.

SUMMARY

A method to provide various refresh periods using the temperature information provided by an on-chip temperature sensor or a TCSR mode can assist in power conservation and can reduce power consumption by a self-refresh current. An oscillator can be modified to provide various refresh periods using temperature information from an on-chip thermometer or a TCSR mode. A power-conserving oscillator can include digital logic to effectively determine various refresh periods.

In a general aspect, an oscillator circuit includes a capacitor device, a current source for supplying a current to the capacitor device, a reference voltage, and a control circuit. The reference voltage can be a first input to a comparator. An output of the capacitor device and an output of the current source can be a second input to the comparator. The control circuit can reset the oscillator circuit when the first and second inputs to the comparator are equal.

Some or all of the following features may be included in the above implementation. The current source can include a plurality of transistors. Based upon temperature information, a value of the current from the current source can vary as each transistor being on or off and the current provided by the current source to the capacitor device can be modified such that a refresh period of the oscillator circuit can be generated.

The temperature information can be provided by an external source. Alternately, the temperature information can be provided by an on-chip thermometer.

The capacitor device can include a plurality of capacitors. Based upon temperature information, a capacitor ratio can be modified and a value of the capacitor device can vary such that a refresh period of the oscillator circuit can be generated.

The temperature information can be provided by an external source. Alternately, the temperature information can be provided by an on-chip thermometer.

The reference voltage can vary, and based upon temperature information, a refresh period of the oscillator circuit of the oscillator can be generated.

The temperature information can be provided by an external source. Alternately, the temperature information can be provided by an on-chip thermometer.

In another general aspect, an oscillator circuit includes a capacitor device, a current source for supplying a charging current for the capacitor device, a reference voltage, and a control circuit. The capacitor device can include a plurality of capacitors. The current source can include a plurality of transistors. The reference voltage can be a first input to a comparator. An output of the capacitor device and an output of the current source can be a second input to the comparator. Based upon temperature information, a capacitor ratio can be modified and a value of the capacitor device can vary, each transistor can be on or off and a value of the current from the current source to the capacitor device can vary, and the reference voltage can vary such that a refresh period of the oscillator circuit of the oscillator can be generated. The control circuit can reset the oscillator circuit when the first and second inputs to the comparator are equal.

Some or all of the following features may be included in the above implementation. The temperature information can be provided by an external source. Alternately, the temperature information can be provided by an on-chip thermometer.

In another general aspect, a circuit configuration includes an oscillator circuit that has a capacitor device, a current source for supplying a current to the capacitor device, a reference voltage, a control circuit, and a frequency divider.

The reference voltage can be a first input to a comparator. An output of the capacitor device and an output of the current source can be a second input to the comparator. The control circuit can reset the oscillator circuit when the first and second inputs to the comparator are equal.

Some or all of the following features may be included in the above implementation. The frequency divider can include at least one latch and a multiplier. Based upon temperature information, the frequency divider can select and output a multiplier for a refresh period of the oscillator circuit.

The temperature information can be provided by an external source. Alternately, the temperature information can be provided by an on-chip thermometer.

The current source can include a plurality of transistors. Based upon temperature information, a value of the current from the current source can vary as each transistor being on or off and the current provided by the current source to the capacitor device can be modified such that a refresh period of the oscillator circuit can be generated.

The temperature information can be provided by an external source. Alternately, the temperature information can be provided by an on-chip thermometer.

In another general aspect, a method of providing temperature control to an oscillator circuit includes providing an oscillator circuit that has a capacitor device, a current source for supplying a current to the capacitor device, a reference voltage, and a control circuit. The reference voltage can be a first input to a comparator. An output of the capacitor device and an output of the current source can be a second input to the comparator. The control circuit can reset the oscillator circuit when the first and second inputs to the comparator are equal.

Some or all of the following features may be included in the above method. The current source can include a plurality of transistors. Based upon temperature information, a value of the current from the current source can vary as each transistor being on or off and the current provided by the current source to the capacitor device can be modified such that a refresh period of the oscillator circuit can be generated.

The temperature information can be provided by an external source. Alternately, the temperature information can be provided by an on-chip thermometer.

The capacitor device can include a plurality of capacitors. Based upon temperature information, a capacitor ratio can be modified and a value of the capacitor device can vary such that a refresh period of the oscillator circuit can be generated.

The temperature information can be provided by an external source. Alternately, the temperature information can be provided by an on-chip thermometer.

The reference voltage can vary, and based upon temperature information, a refresh period of the oscillator circuit of the oscillator can be generated.

The temperature information can be provided by an external source. Alternately, the temperature information can be provided by an on-chip thermometer.

In another general aspect, a method of providing temperature control to an oscillator circuit that includes providing an oscillator circuit that has a capacitor device, a current source for supplying a charging current for the capacitor device, a reference voltage, and a control circuit. The capacitor device can include a plurality of capacitors. The current source can include a plurality of transistors. The reference voltage can be a first input to a comparator. An output of the capacitor device and an output of the current source can be a second input to the comparator. Based upon temperature information, a capacitor ratio can be generated and a value of the capacitor device can vary, each transistor can be on or off and a value of the current from the current source to the capacitor device can vary, and the reference voltage can vary such that a refresh period of the oscillator circuit of the oscillator can be generated. The control circuit can reset the oscillator circuit when the first and second inputs to the comparator are equal.

Some or all of the following features may be included in the above method. The temperature information is provided by an external source. Alternatively, the temperature information is provided by an on-chip thermometer.

In another general aspect, a method of providing temperature control to an oscillator circuit includes providing an oscillator circuit that has a capacitor device, a current source for supplying a current to the capacitor device, a reference voltage, a control circuit, and providing a frequency divider.

The reference voltage can be a first input to a comparator. An output of the capacitor device and an output of the current source can be a second input to the comparator. The control circuit can reset the oscillator circuit when the first and second inputs to the comparator are equal.

Some or all of the following features may be included in the above method. The frequency divider can include at least one latch and a multiplier. Based upon temperature information, the frequency divider can select and output a multiplier for a refresh period of the oscillator circuit.

The temperature information can be provided by an external source. Alternately, the temperature information can be provided by an on-chip thermometer.

The current source can include a plurality of transistors. Based upon temperature information, a value of the current from the current source can vary as each transistor being on or off and the current provided by the current source to the capacitor device can be modified such that a refresh period of the oscillator circuit can be generated.

The temperature information can be provided by an external source. Alternately, the temperature information can be provided by an on-chip thermometer.

The details of one or more embodiments are set forth in the accompanying drawings and the description below. Other features will be apparent from the description and drawings and from the claims.

BRIEF DESCRIPTION OF THE DRAWINGS

FIG. 4A illustrates an oscillator with modification to the current according to the present invention;

FIG. 4B is a table reflecting refresh periods for the oscillator of FIG. 4A;

FIG. 5A illustrates an oscillator with a modification to the capacitance according to the present invention;

FIG. 5B is a table reflecting refresh periods for the oscillator of FIG. 5A;

FIG. 6A illustrates an oscillator with a modification to the reference voltage according to the present invention;

FIG. 6B is a table reflecting refresh periods for the oscillator of FIG. 6A;

FIG. 8A illustrates an oscillator with a modification to the current;

FIG. 8B is a block diagram of the oscillator of FIG. 8A in combination with a frequency divider and a series of latches; and FIG. 8C is a table reflecting refresh periods for the device of FIG. 8B.

Like reference symbols in the various drawings indicate like elements.

DETAILED DESCRIPTION

Various refresh periods using temperature information provided by an on-chip temperature sensor or a Temperature Compensated Self Refresh (TCSR) mode can assist in conserving power used as a result of the self-refresh current IDD6. An oscillator with an on-chip thermometer or a TCSR mode can determine various refresh periods using the temperature information.

Figure 1A:
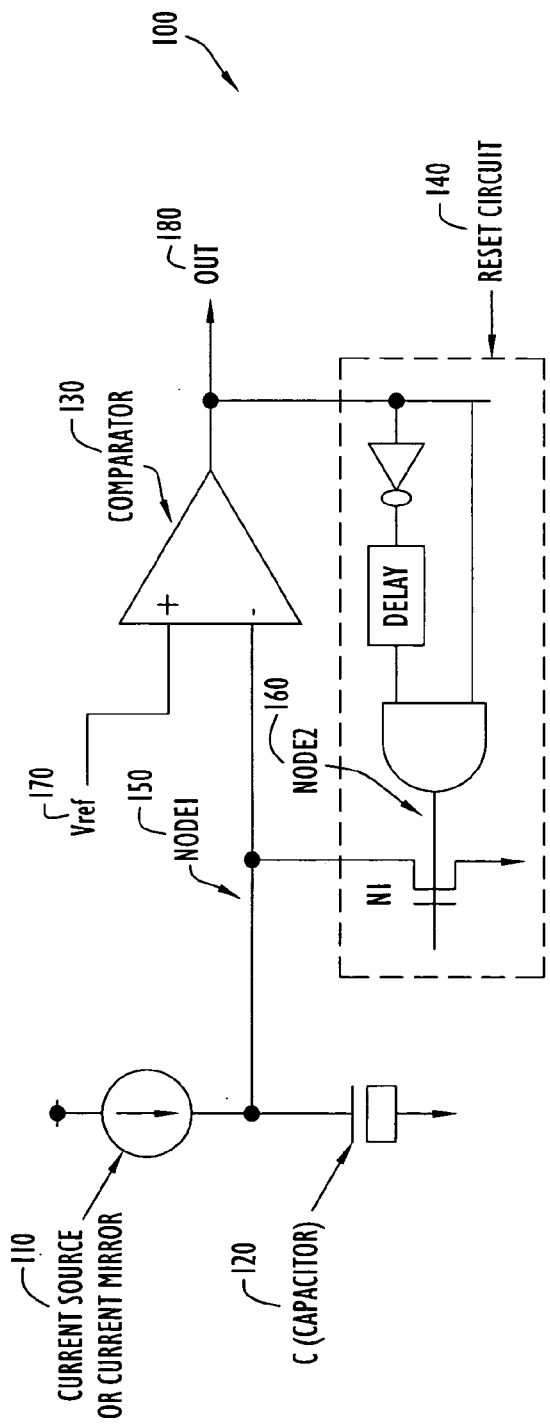
FIG. 1A illustrates a known analog oscillator circuit.
Figure 1B:
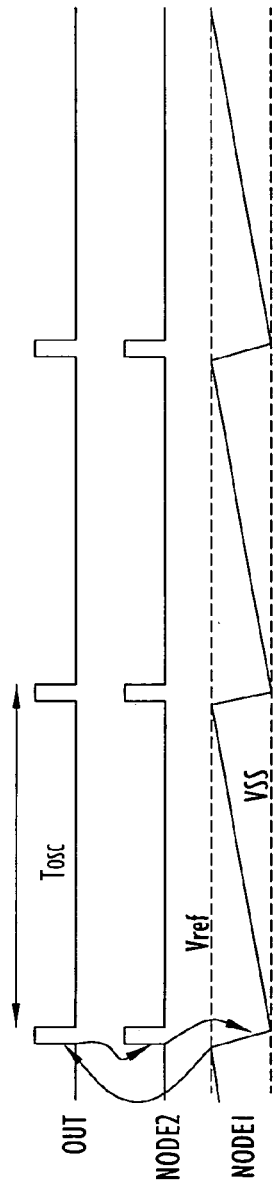
FIG. 1B is a timing diagram for the oscillator of FIG. 1A.
Figures 2A, 2B:
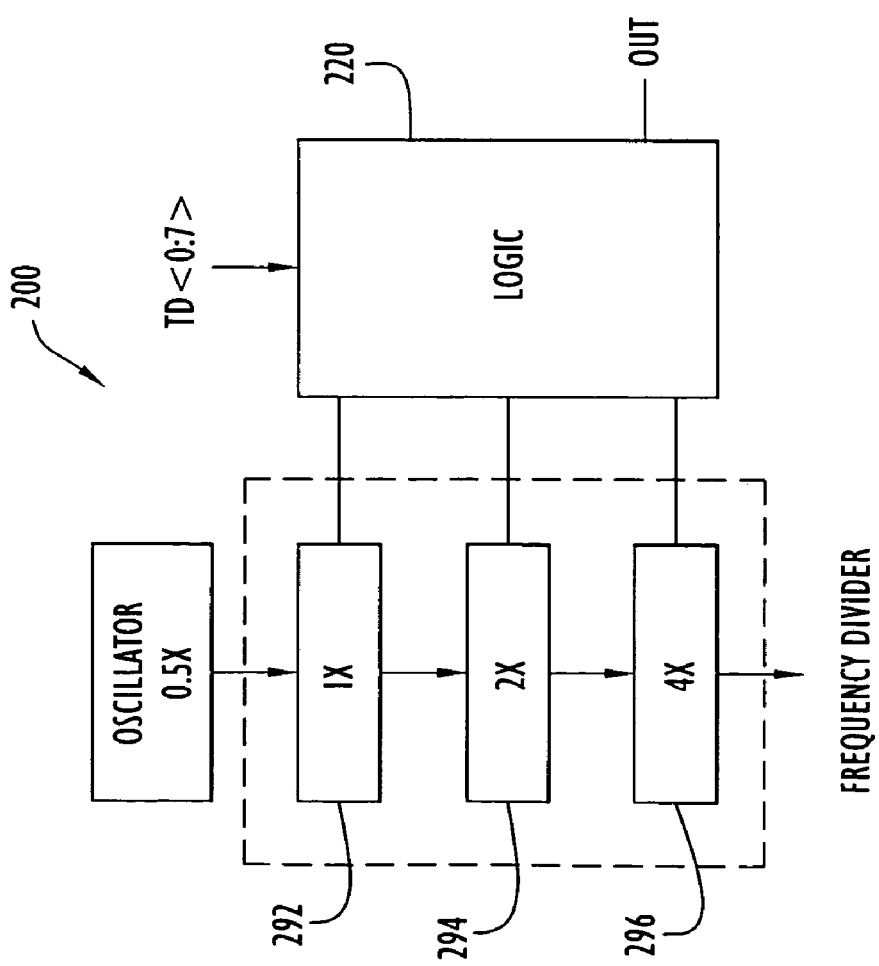
FIG. 2A is a block diagram of a known oscillator with a frequency divider with digital logic.
FIG. 2B is a table reflecting refresh periods for the oscillator of FIG. 2A.
Figure 3A:
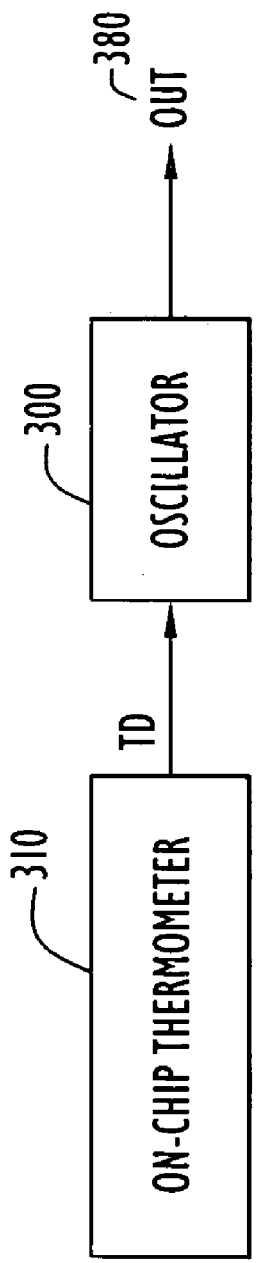
FIG. 3A is a block diagram of an embodiment of an oscillator according to the present invention.
Figure 3B:
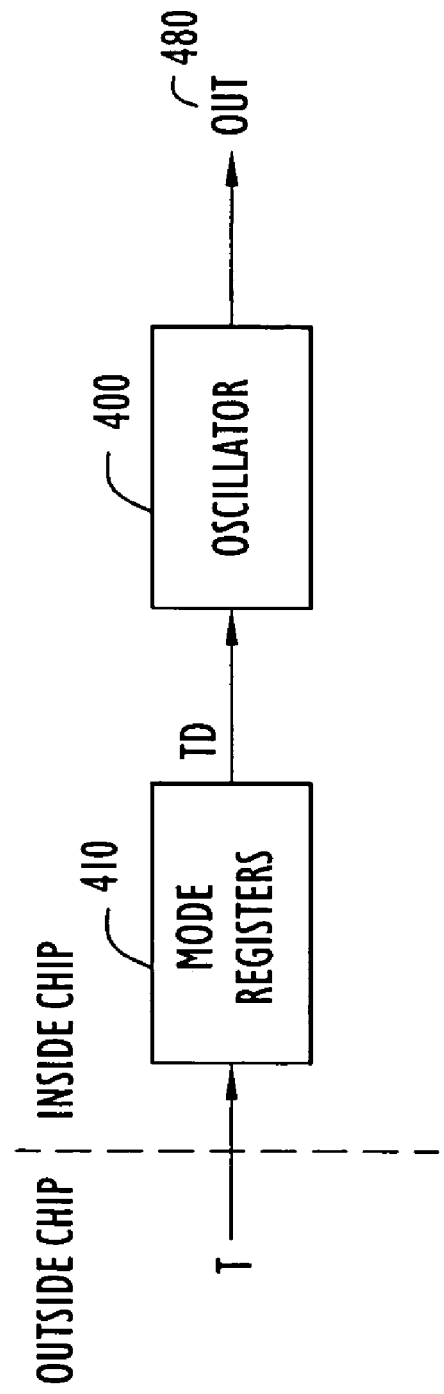
FIG. 3B is a block diagram of another embodiment of an oscillator according to the present invention.

Referring to FIGS. 3A and 3B, an oscillator can receive temperature information from an on-chip thermometer 310 or through a Temperature Compensated Self Refresh (TCSR) mode. An on-chip thermometer 310 would provide temperature information TD to the oscillator 300. The temperature information provided by an on-chip thermometer can be more accurate than the temperature information from registers. Using this temperature information and calculated or known refresh characteristics over temperature, different refresh periods at different temperatures can be used to reduce the self-refresh current IDD6.

In order to reduce the frequency of refresh of the self-refresh current IDD6, a TCSR mode can be used in low-power SDRAM design. In the TCSR mode, the temperature information T from an outside chip or an external temperature sensor (not shown) can be stored in registers 410 and provided to the oscillator 400, and the refresh period Tref (DRAM refresh period) can be adjusted according to the temperature information. Since the refresh characteristics at cooler temperatures are generally better than at higher temperatures, the refresh period Tref at cooler temperatures can be increased to reduce the self-refresh current IDD6.

The base frequency of an oscillator can be changed based on received temperature information. The temperature information is received from an external thermometer that has generally been stored in mode registers of memory chips or from an on-chip thermometer, for instance, as described above.

Generally, there are three parameters that can change the base frequency of an oscillator: (1) current values, (2) capacitor values, and/or (3) change the value of the reference voltage level Vref.

Referring to FIG. 4A, an oscillator with a modification to the current is one way to change the base frequency. By changing the base frequency of the oscillator, the refresh period Tref can be changed.

The oscillator 500 includes a current source 510 with temperature controls, a capacitor C 520, a comparator 530, and a reset circuit 540. Temperature information TD1, TD2, TD3, TD4 can control the current flow to node 1 550 so that the base frequency of the oscillator 500 can be changed. The temperature information can be provided from a TCSR mode or an on-chip thermometer, as described above. In this example, the size of transistors P3, P4, P5, and P6 are the same. So, for example, when the four transistors are turned on, the refresh period is the shortest, i.e., 1×. When P10 is turned off, the current can be reduced 25%, and the oscillator period can be increased 33%. When P10 and P9 are turned off, the current can be reduced 50%, and the oscillator period can be increased 100%. Likewise, other transistors can be turned on and off to adjust the oscillator period. With additional PMOS transistors, more refresh periods can be generated in the oscillator.

Structurally, the current source 510 includes a plurality of transistors, in this example, both PMOS and NMOS. Specifically, there are two NMOS transistors N1 and N2, and ten PMOS transistors P1, P2, P3, P4, P5, P6, P7, P8, P9, and P10. Temperature information is provided, for example, along four paths TD1, TD2, TD3, and TD4. There are four parallel paths. The current i is controlled by switching various transistors on and off. The gates of the PMOS transistors P1, P2, P3, P4, P5, and P6 are tied together and the gates of the NMOS transistors N1, N2 are tied together. The sources of the PMOS transistors P1, P2, P3, P4, P5, and P6 are tied together. The drain of one NMOS transistor N1 is tied to the gates of the NMOS transistors N1 and N2. The drain of one NMOS transistor N2 is tied to the gates of the PMOS transistors P1, P2, P3, P4, P5, and P6. The drain of PMOS transistors P3, P4, P5, and P6 are tied to the sources of PMOS transistors P7, P8, P9, and P10, respectively. Temperature information TD1, TD2, TD3, and TD4 is provided at the drain of PMOS transistors P7, P8, P9, and P10, respectively. This analog oscillator solution is relatively simple to control and uses a relatively small area.

FIG. 4B is a table that shows exemplary periods that can be generated. For example, at a temperature less than 10° C., PMOS transistors P7, P8, and P9 would be off, i.e., H, and. PMOS transistor P10 would be on, i.e., L, and therefore the oscillator refresh period Tosc that is generated would be 4× the base frequency. Whereas, at a temperature greater than 70° C., PMOS transistors P7, P8, P9, and P10 would be on, i.e., L, and therefore the oscillator refresh period Tosc that is generated would be 1× the base frequency.

Referring to FIG. 5A, an oscillator with a modification to the capacitance at the node 1 can also change the base frequency of the oscillator. The oscillator 600 includes a current source 610, a capacitor C 620, a comparator 630, and a reset circuit 640. The capacitor C 620 includes temperature controls. Structurally, the capacitor C 620 includes, for example, four capacitors 622, 624, 626, 628 tied to the source of four NMOS transistors N2, N3, N4, N5, respectively. The drains of the capacitors 622, 624, 626, 628 are tied together. Temperature information TD1, TD2, TD3, and TD4 are provided at the gates of each capacitor 622, 624, 626, 628, respectively. As a result, the capacitors 622, 624, 626, 628 can be used to generate periods, such as 1×, 2×, 3×, and 4×.

The temperature information TD1, TD2, TD3, TD4 affects capacitance ratios, and thus, the capacitance C at node 1 so that the base frequency of the oscillator can be changed. The temperature information can be provided from a TCSR mode or an on-chip thermometer as described above.

Referring to FIG. 5B, the table shows the periods that can be generated by the oscillator. For example, as capacitance ratios are changed, i.e., like 0.5 C, 0.25 C, 1 C, and 2 C, based upon TD1, TD2, TD3, and TD4, many oscillator periods can be created. Specifically, for example, at a temperature less than 10° C., the capacitors 622, 624, 626, 628 would be on, i.e., H, and therefore the oscillator refresh period Tosc that is generated would be 4× the base frequency. Whereas, at a temperature greater than 70° C., only capacitor 628 would be on, i.e., H, the other capacitors 622, 624, 626 would be off, i.e., L, and therefore the oscillator refresh period Tosc that is generated would be 1× the base frequency.

Referring to FIG. 6A, the base frequency of an oscillator can be changed by changing the reference voltage level Vref. The oscillator 700 includes a current source 710, a capacitor C 720, a comparator 730, and a reset circuit 740. In this example, the reference voltage Vref 770 varies.

FIG. 6B is a table illustrating the various refresh periods created. For example, for a reference voltage level Vref of 1.2V at a temperature less than 10° C., the oscillator refresh period Tosc is 2×.

Figure 7A:
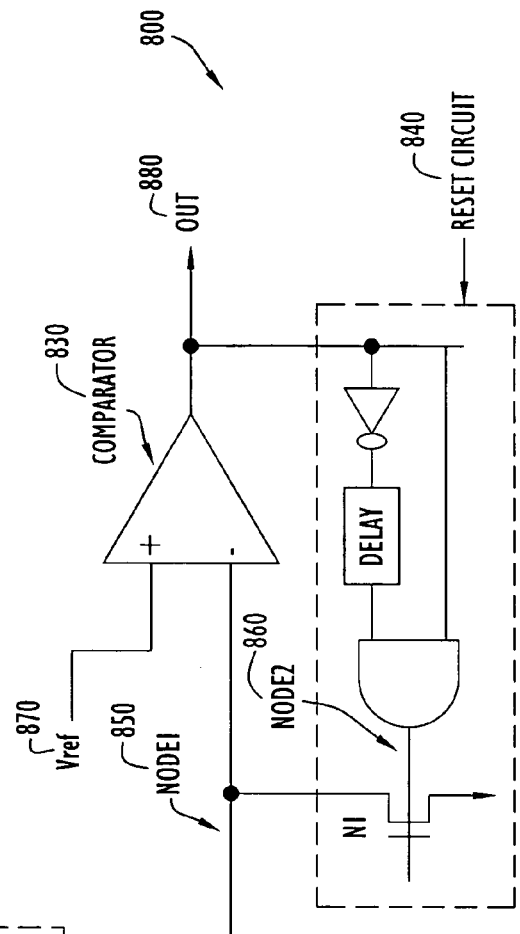
FIG. 7A illustrates an oscillator with a modification to the current, capacitance, and reference voltage according to the present invention.

Alternatively, referring to FIG. 7A, various periods can be generated by varying current, capacitance, and the reference voltage level, i.e., a mixed scheme. The oscillator 800 includes a current source 810 with temperature controls, a capacitor C 820 with temperature controls, a comparator 830, and a reset circuit 840. The reference voltage Vref 870 also varies.

Structurally, the current source 810 includes a plurality of transistors, in this example, both PMOS and NMOS. Specifically, there are two NMOS transistors N1 and N2, and nine PMOS transistors P1, P2, P3, P4, P5, P6, P7, P8, and P9. Temperature information is provided, for example, along one path TD5. There are three parallel paths, however. The current i is controlled by switching various transistors on and off. The gates of the PMOS transistors P1, P2, P3, P4, and P5 are tied together and the gates of the NMOS transistors N1, N2 are tied together. The sources of the PMOS transistors P1, P2, P3, P4, and P5 are tied together. The drain of one NMOS transistor N1 is tied to the gates of the NMOS transistors N1 and N2. The drain of one NMOS transistor N2 is tied to the gates of the PMOS transistors P1, P2, P3, P4, and P5. The drains of PMOS transistors P3, P4, and P5 are tied to the sources of PMOS transistors P7, P8, and P9, respectively. Temperature information TD5 is provided at the drain of PMOS transistors P9. The drains of PMOS transistors P7 and P8 are connected to $V_{SS}$, a ground supply voltage.

The capacitor C 820 includes temperature controls. Structurally, the capacitor C 820 includes, for example, four capacitors 822, 824, 826, 828 tied to the source of four NMOS transistors N1, respectively. The drains of the capacitors 822, 824, 826, 828 are tied together. Temperature information TD1, TD2, TD3, and TD4 are provided at the gates of each capacitor 822, 824, 826, 828, respectively. As a result, the capacitors 822, 824, 826, 828 can be used to generate periods, such as 1×, 2×, 3×, and 4×.

Temperature information can be provided, as described above. In this example, the capacitors 822, 824, 826, 828 can be used to generate integer periods like 1×, 2×, 3×, and 4×, and current source (with P1, P2, P3, P4, P5, P6, P7, P8, and P9) can be used to generate intermediate periods like 1.5×, 2.5×, 3.5×, and 4.5×.

Figure 7B:
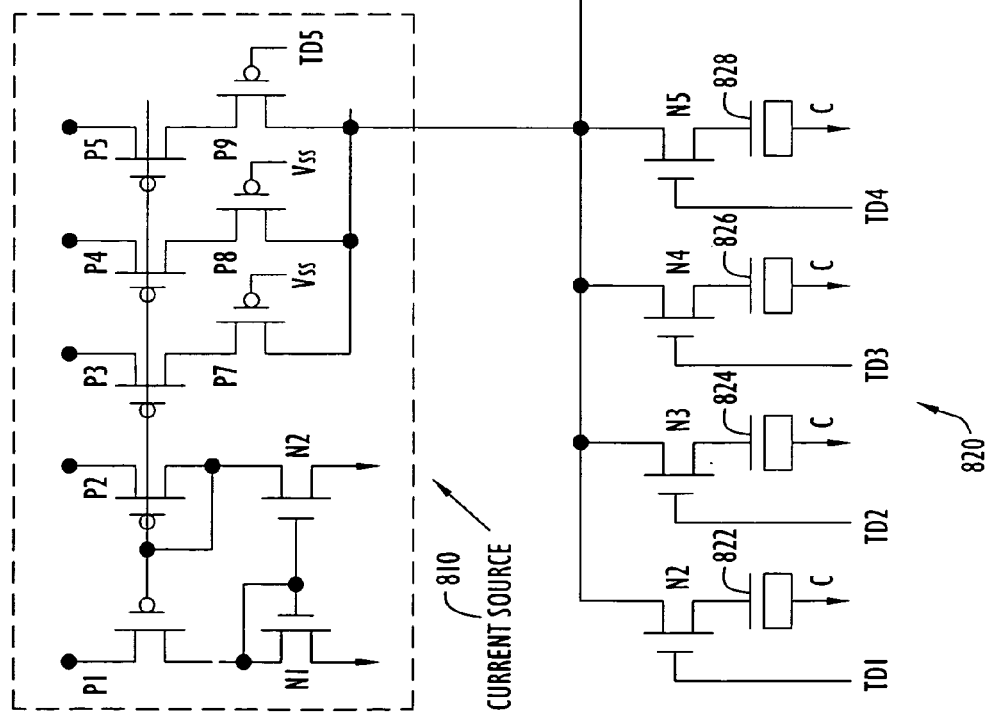
FIG. 7B is a table reflecting refresh periods for the oscillator of FIG. 7A.

FIG. 7B is a table showing exemplary generated periods. For example, as capacitance ratios are changed, i.e., like 0.5 C, 0.25 C, 1 C, and 2 C, based upon TD1, TD2, TD3, and TD4, many oscillator periods can be created. Specifically, for example, at a temperature of 10° C., the capacitors 822, 824, 826, 828 would be on, i.e., H, PMOS transistor P9 would on, i.e., L, and therefore the oscillator refresh period Tosc that is generated would be 4× the base frequency. Whereas, at a temperature of 70° C., only capacitor 828 would be on, i.e., H, the other capacitors 822, 824, 826 and PMOS transistor P9 would on, i.e., L, and therefore the oscillator refresh period Tosc that is generated would be 1× the base frequency.

Alternatively, referring to FIGS. 8A–8C, an oscillator can be combined with digital technology to also provide various refresh periods. The oscillator 900 includes a current source 910 with temperature controls, a capacitor C 920, a comparator 930, and a reset circuit 940. The structure of the current source 910 is like the current source 810 described above in relation to FIG. 7A. Specifically, there are two NMOS transistors N1 and N2, and nine PMOS transistors P1, P2, P3, P4, P5, P6, P7, P8, and P9. Temperature information is provided, for example, along one path TD5. There are three parallel paths, however. The current i is controlled by switching various transistors on and off. The gates of the PMOS transistors P1, P2, P3, P4, and P5 are tied together and the gates of the NMOS transistors N1, N2 are tied together. The sources of the PMOS transistors P1, P2, P3, P4, and P5 are tied together. The drain of one NMOS transistor N1 is tied to the gates of the NMOS transistors N1 and N2. The drain of one NMOS transistor N2 is tied to the gates of the PMOS transistors P1, P2, P3, P4, and P5. The drains of PMOS transistors P3, P4, and P5 are tied to the sources of PMOS transistors P7, P8, and P9, respectively. Temperature information TD5 is provided at the drain of PMOS transistors P9. The drains of PMOS transistors P7 and P8 are connected to $V_{SS}$, a negative supply voltage. The base frequency of such an oscillator 900, for example, is 0.5×.

Temperature information TD5 can control the current flow to node 1 950 so that the base frequency of the oscillator 900 can be changed. The temperature information can be provided from a TCSR mode or an on-chip thermometer, as described above.

As shown in FIG. 8B, the mixed scheme can be combined with a digital scheme. In this example, an oscillator 900 with current modification (FIG. 8A) in combination with a digital circuit, e.g., a frequency divider, 990 can generate integer periods, like 1×, 2×, and 4× 992, 994, 996, and a current source 910 can generate intermediate periods, like 1.5×, 3×, and 6× (see FIG. 8C). The current source 910 can be a current mirror. The frequency divider 990 in conjunction with temperature information TD2, TD3, TD4 993, 995, 997 can provide additional refresh periods. This mixed scheme also needs less area compared to pure digital scheme.

FIG. 8C is a table showing exemplary refresh periods that can be generated. Specifically, for example, at a temperature of 20° C., PMOS transistor P9 would on, i.e., L, latches 993 and 995 would be open, i.e., off, latch 997 would be closed, i.e., on, and therefore the oscillator refresh period Tosc that is generated would be 6× [4× times 0.5× (the base frequency)]. Whereas, at a temperature of 70° C., PMOS transistor P9 would off, i.e., H, latches 995 and 997 would be open, i.e., off, latch 993 would be closed, i.e., on, and therefore the oscillator refresh period Tosc that is generated would be 1×.

An oscillator with temperature control can provide many refresh periods in a small area. If the new oscillator with temperature control is combined with a digital frequency divider, additional refresh periods can be provided in a simpler and smaller way are possible.

A number of implementations have been described. Nevertheless, it will be understood that various modifications may be made without departing from the spirit and scope. Accordingly, other embodiments are within the scope of the following claims.

What is claimed is:

1. A temperature-controlled oscillator, comprising:
   an oscillator circuit including;
      a capacitor device;
      a current source for supplying a current to the capacitor device, wherein the current source comprises an input that receives a first temperature control signal, an output that supplies an output current that is connected to a first terminal of the capacitor device, a first plurality of P-type transistors whose gates are connected together and whose sources are connected together, a plurality of N-type transistors whose gates are connected together, and wherein a drain of one of the N-type transistors is connected to the gates of the first plurality of P-type transistors and a drain of one of the N-type transistors is connected to the gates of the N-type transistors, and a second plurality of P-type transistors having sources that are connected to drains of a subset of the first plurality of P-type transistors, and wherein a drain of one of the second plurality of P-type transistors is connected to the input that receives the first temperature control signal that controls the output current supplied at the output of the current source;
      a comparator that has first and second inputs and an output, the first input of the comparator being connected to a reference voltage and the second input being connected to said first terminal of the capacitor device, wherein the comparator generates a signal at its output when the voltage at the second input is eciual to the reference voltage;
      a control circuit having an input connected to the output of the comparator and an output connected to the second input of the comparator to reset the oscillator circuit when the voltage at the second comparator input is equal to the reference voltage; and
      a frequency divider connected to the output of the comparator, wherein the frequency divider comprises a plurality of multipliers, each of which multiplies by a different multiplier value when selected by a corresponding temperature control signal;
   wherein the oscillator circuit is responsive to the first temperature control signal to produce the output signal of the comparator that has a frequency at a multiplier value that is different than the multiplier values generated by the frequency divider.

2. The temperature-controlled oscillator of claim 1, wherein the multiplier values of the multipliers in the frequency divider are integer values and the multiplier value produced by the oscillator circuit is a fractional value.

3. The temperature-controlled oscillator of claim 1, wherein the temperature information is provided by an external source.

4. The temperature-controlled oscillator of claim 1, wherein the temperature information is provided by an on-chip temperature sensor.

5. The temperature-controlled oscillator of claim 1, wherein selected ones of the first and second pluralities of P-type transistors and plurality of N-type transistors are switched on in response to the first temperature control signal.

6. The temperature-controlled oscillator of claim 5, wherein the temperature information is provided by an external source.

7. The temperature-controlled oscillator of claim 5, wherein the temperature information is provided by an on-chip chip temperature sensor.

8. A method for generating an oscillating signal whose frequency is temperature-dependent for a refresh function of an integrated circuit memory device, comprising:
   a. sensing a temperature of an integrated circuit memory device;
   b. generating a temperature-dependent electrical current by activating selected ones of a plurality of P-type transistors and N-type transistors depending on the temperature of the integrated circuit device;
   c. supplying the temperature-dependent electrical current to a capacitor;
   d. comparing a voltage across the capacitor with a reference voltage to generate an output signal when the capacitor voltage is equal to the reference voltage;
   e. coupling the output signal to a frequency divider comprising a plurality of multipliers each of which is capable of multiplying by a different multiplier value; and
   f. selecting one or more of the multipliers in the frequency divider depending on the temperature of the integrated circuit device so as to produce said temperature-dependent oscillating signal at the output of the frequency divider.

9. The method of claim 8, wherein (a) sensing comprises sensing the temperature with a temperature sensor external to the integrated circuit memory device.

10. The method of claim 8, wherein (a) sensing comprises sensing the temperature with an on-chip temperature sensor.

11. The method of claim 8, wherein (b) generating comprises generating the output signal that has a frequency at a multiplier value different than the multiplier values of the plurality of multipliers.

12. The method of claim 8, wherein (b) generating comprises generating the output signal that has a frequency with a fractional multiplier value and (f) selecting comprises selecting one or more of the multipliers, each of which has a different integer multiplier value.

13. The method of claim 12, wherein (b) generating and (f) selecting are coordinate to produce said temperature-dependent oscillator signal with a frequency that is a combination of said fractional multiplier value with one or more of the different integer multipliers values.

* * * * *

UNITED STATES PATENT AND TRADEMARK OFFICE
CERTIFICATE OF CORRECTION

| | |
|---|---|
| PATENT NO. | : 7,123,105 B2 |
| APPLICATION NO. | : 10/739398 |
| DATED | : October 17, 2006 |
| INVENTOR(S) | : Jung Pill Kim et al. |

It is certified that error appears in the above-identified patent and that said Letters Patent is hereby corrected as shown below:

Col. 9, l. 24    Replace " ; " with -- : --

Col. 9, l. 52    Replace "eciual" with -- equal --

Col. 10, l. 65   Replace "multipliers" with -- multiplier --

Signed and Sealed this

Twenty-seventh Day of November, 2007

JON W. DUDAS
*Director of the United States Patent and Trademark Office*